United States Patent
Chen et al.

(10) Patent No.: US 7,100,127 B2
(45) Date of Patent: Aug. 29, 2006

(54) IMPEDANCE MATCHING CIRCUIT DESIGN METHOD

(75) Inventors: Chun-Zen Chen, Taipei (TW); Bo-Fu Wu, Kaohsiung (TW); Chia-Hung Su, Kaohsiung (TW)

(73) Assignee: Benq Corporation, Taoyuan (TW)

( * ) Notice: Subject to any disclaimer, the term of this patent is extended or adjusted under 35 U.S.C. 154(b) by 360 days.

(21) Appl. No.: 10/736,376

(22) Filed: Dec. 15, 2003

(65) Prior Publication Data

US 2004/0128629 A1 Jul. 1, 2004

(30) Foreign Application Priority Data

Dec. 26, 2002 (TW) ............................... 91137439 A

(51) Int. Cl.
*G06F 17/50* (2006.01)
(52) U.S. Cl. .................................... 716/1; 716/4; 716/5
(58) Field of Classification Search .................... 716/1, 716/4, 5; 330/17.3, 32, 124, 86, 94, 105; 326/30
See application file for complete search history.

(56) References Cited

U.S. PATENT DOCUMENTS 6,275,114 B1 * 8/2001 Tanji et al. ................. 330/308
6,639,471 B1 * 10/2003 Matsuura et al. ........... 330/302

* cited by examiner

*Primary Examiner*—Vuthe Siek
(74) *Attorney, Agent, or Firm*—Snell & Wilmer L.L.P.

(57) ABSTRACT

The present invention provides a method for designing an impedance matching circuit. The impedance matching circuit is for matching a power amplifier and an antenna circuit. The antenna circuit originally includes an antenna and a first antenna impedance matching circuit. For suiting the design modification of the power amplifier, the method provides a second antenna impedance matching circuit, and matches it with a first power amplifier impedance matching circuit to constitute an overall circuit. The impedance of the overall circuit forms a first locus on the Smith Chart, and is made to have a phase error meeting a predetermined specification. Next, the second power amplifier impedance matching circuit is designed and matched with the first antenna impedance matching circuit to constitute another overall circuit. And the impedance of this overall circuit forms a second locus on the Smith Chart. As the second locus overlaps the first locus, the system has a phase error meeting a predetermined specification.

5 Claims, 4 Drawing Sheets

| Conducted Test result | | Ch975 | Ch1 | Ch62 | Ch124 |
|---|---|---|---|---|---|
| | Power | 32.0dBm | 31.9dBm | 32.0dBm | 31.9dBm |
| | Current | 1.71A | 1.67A | 1.63A | 1.60A |
| | Phase error peak | -10.9deg | -14.4deg | -14.0deg | -15.9deg |
| Wireless Test result | Power | 20.3dBm | 22.4dBm | 23.2dBm | 22.4dBm |
| | Current | - | - | - | - |
| | Phase error peak | 31.1deg | 31.0deg | 28.8deg | 30.2deg |

| Conducted Test result | | Ch975 | Ch1 | Ch62 | Ch124 |
|---|---|---|---|---|---|
| | Power | 32.04dBm | 32.01dBm | 31.99dBm | 32.01dBm |
| | Current | - | - | - | - |
| | Phase error peak | 8.53deg | 8.52deg | 7.84deg | 6.63deg |
| Wireless Test result | Power | 29.6dBm | 30.7dBm | 30.0dBm | 31.3dBm |
| | Current | - | - | - | - |
| | Phase error peak | -16.2deg | 10.2deg | -13.1deg | -10.9deg |

IMPEDANCE MATCHING CIRCUIT DESIGN METHOD

CROSS-REFERENCE TO RELATED APPLICATIONS

This application claims priority of Taiwan Patent Application Serial No. 091137439 filed on Dec. 26, 2002.

FIELD OF INVENTION

The present invention relates to a method for designing an impedance matching circuit, and especially to a method for matching a power amplifier and an antenna impedance matching circuit to form a circuit with phase error meeting a predetermined specification.

BACKGROUND OF THE INVENTION

An antenna impedance matching circuit designed for matching an antenna and a power amplifier impedance matching circuit designed for matching a power amplifier are necessary components of receiving/transmitting circuit of wireless communication systems. Modifying the power amplifier impedance matching circuit is a more complicated way of improving overall impedance matching. Therefore, instead, it is typical to modify the antenna impedance matching circuit to meet the requirement.

However, modifying the antenna impedance matching circuit needs lots of time for testing and simulating. It would delay the design schedule or result in cost increase under some conditions. For example, it is costly and time-consuming for a wireless circuit to obtain certification from a certification institute. Therefore once the antenna circuit including the antenna and the antenna impedance matching circuit is certified, keeping it unchanged would be a designer's first choice. Therefore the power amplifier impedance matching circuit would be modified instead. The most common method of modifying the impedance matching circuit is a "trial and error" one, which costs much effort. Hence another method for designing the impedance matching circuit to make the phase error meet the specification without altering an already certified circuit is needed.

SUMMARY OF THE INVENTION

One aspect of the present invention provides a method for designing an impedance matching circuit used for matching a power amplifier and an antenna. The impedance matching circuit includes a first antenna impedance matching circuit and a first power amplifier impedance matching circuit. The method, instead of altering the antenna impedance matching circuit, designs an impedance matching circuit, which makes the phase error meet the specification by comparing impedance range.

The original overall circuit includes an antenna, a first antenna impedance matching circuit, a first power amplifier impedance matching circuit and a power amplifier. The antenna and the first antenna impedance matching circuit would be kept unchanged when modifying the overall circuit. The method includes the following steps. A second antenna impedance matching circuit is provided to match with the first power amplifier impedance matching circuit to form a first overall circuit. The second antenna impedance matching circuit is adjusted so that a phase error of a signal outputted by the antenna meets a predetermined specification. The impedance range of the first overall circuit is estimated, and displayed by a first locus on the Smith Chart. Then a second power amplifier impedance matching circuit is designed to match with the first antenna impedance matching circuit to form a second overall circuit. A second impedance range of the second overall circuit is estimated, and displayed by a second locus on the Smith Chart. The second power amplifier impedance matching circuit is adjusted to make the second locus overlap with the first locus. Then the second overall circuit also has phase error meeting the specification.

The step of adjusting the second power amplifier impedance matching circuit mentioned above may be achieved by actually measuring the second impedance range through "trial and error", or by simulating the second impedance range by software.

BRIEF DESCRIPTION OF THE DRAWINGS

For a more complete understanding of the present invention, and the advantage thereof, reference is now made to the following descriptions taken in conjunction with the accompanying drawings, in which:

FIG. 5(a) is a table of phase errors not meeting a predetermined specification;

FIG. 5(b) is a table of phase errors meeting the predetermined specification;

DETAILED DESCRIPTION

Figure 1:
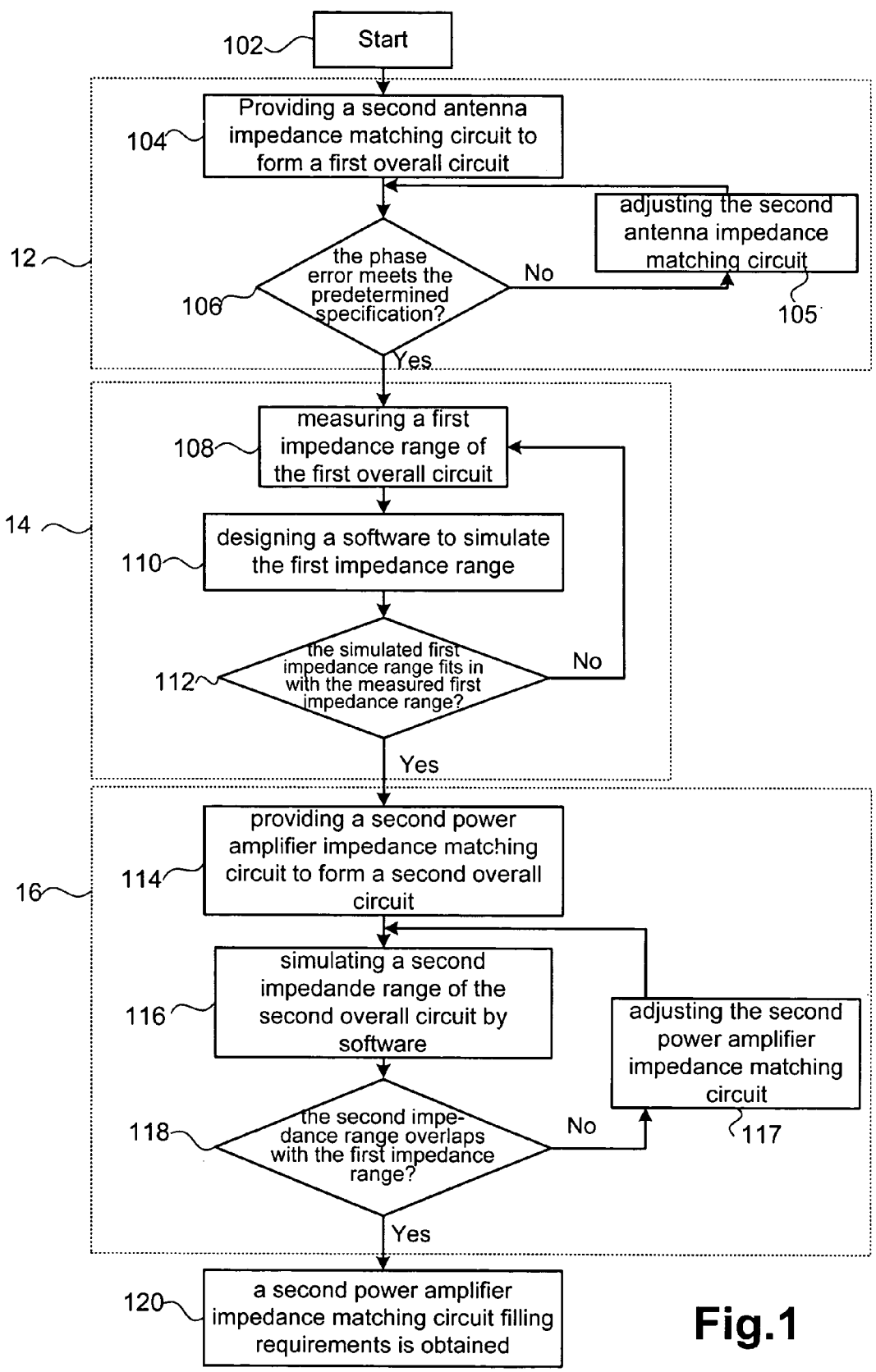
FIG. 1 is a flow chart of a preferred exemplary embodiment.
Figure 2:
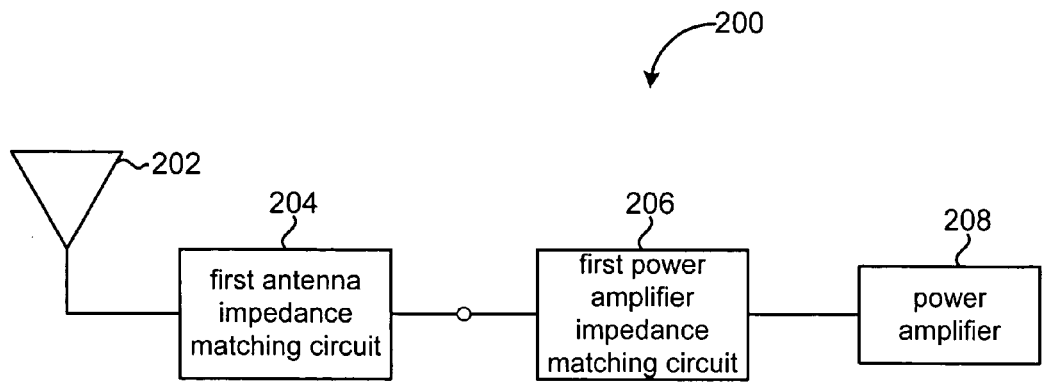
FIG. 2 is a block diagram of an original overall circuit.
Figure 3:
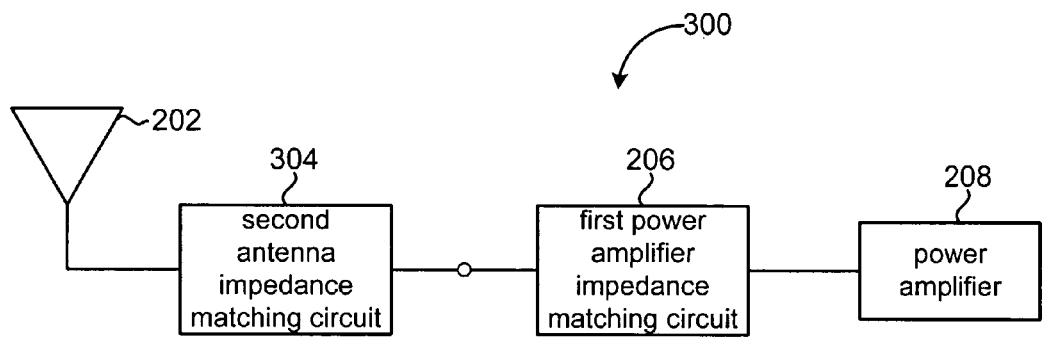
FIG. 3 is a block diagram of a first overall circuit.
Figure 4:
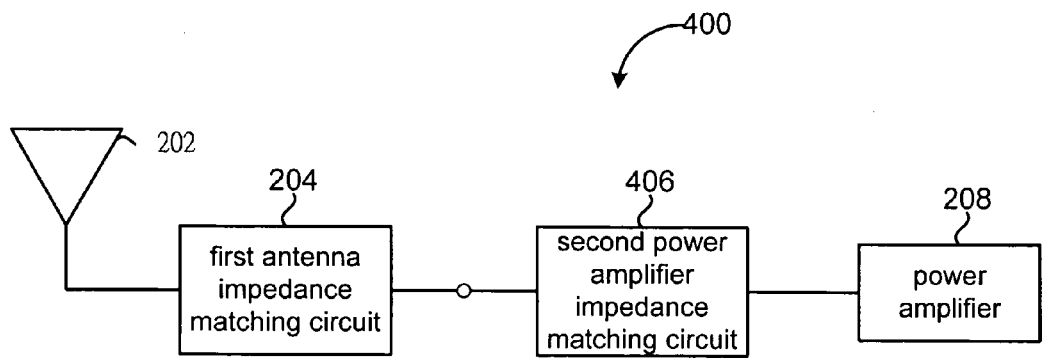
FIG. 4 is a block diagram of a second overall circuit.

A method for designing an impedance matching circuit is provided. FIG. 1 is a flow chart of a preferred exemplary embodiment. FIG. 2 is a block diagram of an original overall circuit 200. On condition that the first antenna impedance matching circuit 204 is kept, the first power amplifier impedance matching circuit 206 is modified to make the phase error of the overall circuit 200 meet a predetermined specification.

Referring to FIG. 1, the preferred exemplary embodiment has three stages. In the first stage 12, the antenna impedance matching circuit is altered to make the phase error of the overall circuit, with the same power amplifier impedance matching circuit, meet a predetermined specification. In the second stage 14, the impedance range of the overall circuit is estimated, and displayed by a locus on the Smith Chart. In the third stage 16, a new power amplifier impedance matching circuit is used for matching the original antenna impedance matching circuit to form another overall circuit. The locus displaying the impedance range of this overall circuit is made to overlap with the locus mentioned above. Then this overall circuit has performance meeting the specification as well.

Referring to FIG. 1, FIG. 3, FIG. 5(a), FIG. 5(b) and FIG. 6(a), a second antenna impedance matching circuit 304 is provided to match with the first power amplifier impedance matching circuit 206 to form a first overall circuit 300 (step 104). The phase error of the signal outputted by the antenna 202 of the first overall circuit 300 is measured (e.g. 30 deg), and is judged if meets a predetermined specification (e.g. 15 deg) (step 106). If not (e.g. phase errors 502a), the second antenna impedance matching circuit 304 is adjusted (step 105) until the phase errors meet the predetermined specification (e.g. phase errors 502), and a second antenna impedance matching circuit 304 filling requirements is obtained. Then a first impedance range of the first overall circuit 300 is measured (step 108). The first impedance range of the first overall circuit 300 is also simulated and displayed by a first locus 602 on the Smith Chart (step 110). The simulated first impedance range is checked if fits in with the measured first impedance range (step 112). If not, the first impedance range is measured and simulated repeatedly until the simulated first impedance range fits in with the measured first impedance range.

Figure 6A:
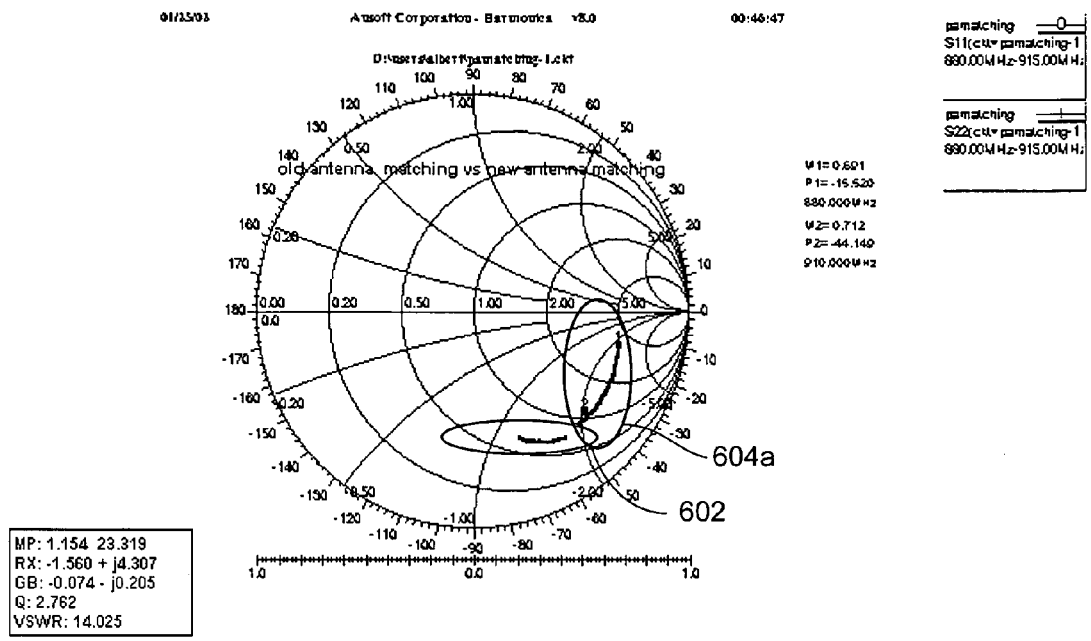
FIG. 6(a) is the Smith Chart showing a first impedance range and a non-final second impedance range.
Figure 6B:
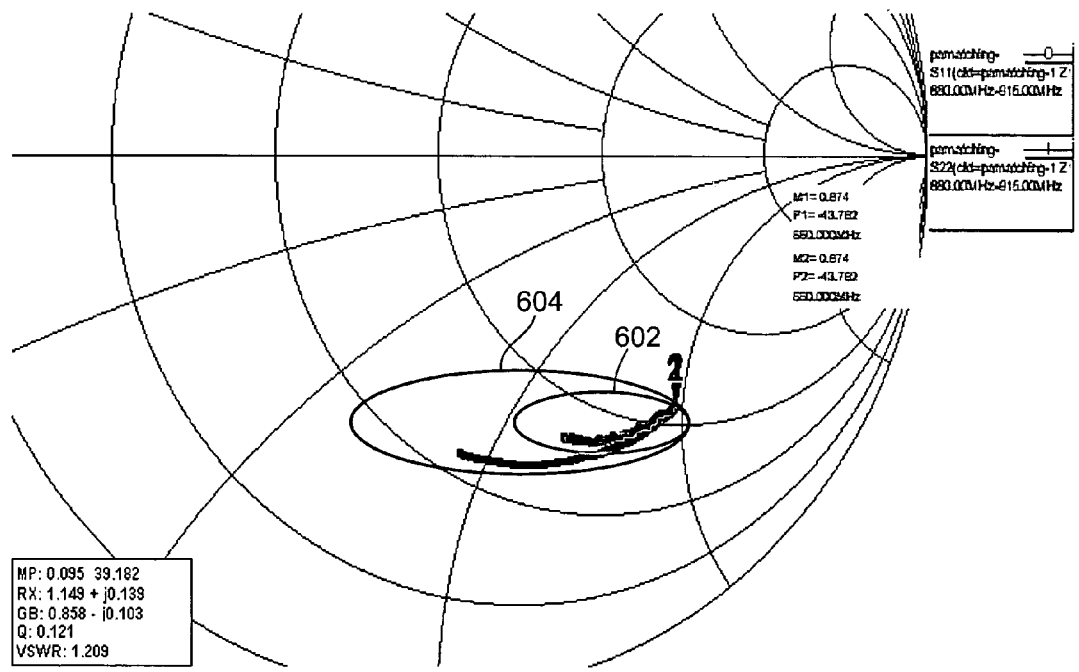
FIG. 6(b) is the Smith Chart showing the first impedance range and a final second impedance range.

Referring to FIG. 1, FIG. 4, FIG. 6(a) and FIG. 6(b), a second power amplifier impedance matching circuit 406 is provided to match with the first antenna impedance matching circuit 204 to form a second overall circuit 400 (step 114). The second impedance range of the second overall circuit 400 is simulated (step 116), and is displayed by a second locus 604a on the Smith Chart. The second locus 604a is checked to see if it overlaps with the first locus 602 (step 118). If not (as shown in FIG. 6(a)), the second power amplifier impedance matching circuit 406 is adjusted (step 117) until the second locus 604a overlaps with the first locus 602, as shown in FIG. 6(b). Finally, a second power amplifier impedance matching circuit 406 filling requirements is obtained (step 120) to form a second overall circuit 400 filling requirements.

While this invention has been described with reference to the illustrative embodiment, these descriptions are not is intended to be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

We claim:

1. A method for designing an impedance matching circuit, used for matching a power amplifier and an antenna, and said impedance matching circuit including a first antenna impedance matching circuit and a first power amplifier impedance matching circuit, said method comprising:
    (a) providing a second antenna impedance matching circuit to match with said first power amplifier impedance matching circuit so that a phase error of a signal outputted by said antenna meets a predetermined specification;
    (b) forming a fast overall circuit by said second antenna impedance matching circuit and said first power amplifier Impedance matching circuit, and estimating a first impedance range of said first overall circuit;
    (c) providing a second power amplifier impedance matching circuit to match with said first antenna impedance matching circuit to form a second overall circuit; and
    (d) adjusting a second impedance range of said second overall circuit to make said second impedance range overlap with said first impedance range.

2. The method of claim 1, wherein said first impedance range and said second impedance range are indicated by a locus on a Smith Chart.

3. The method of claim 1, said step (b) further comprising:
    (b1) measuring a first measured impedance range of said first overall circuit;
    (b2) simulating said first impedance range of said first overall circuit by software and displaying said first impedance range by a first locus on the Smith Chart; and
    (b3) repeating said step (b1) when said first measured impedance range is different from said first estimated impedance range.

4. The method of claim 1, said step (d) further comprising:
    (d1) adjusting said second power amplifier impedance matching circuit;
    (d2) simulating said second impedance range of said second overall circuit by software and displaying said second impedance range by a second locus on the Smith Chart; and
    (d3) repeating said step (d1) as said second locus does not overlap with said first locus.

5. A method for designing an impedance matching circuit, used for matching a power amplifier and an antenna, and said impedance matching circuit including a first antenna impedance matching circuit and a first power amplifier impedance matching circuit, said method comprising:
    (a) providing a second antenna impedance matching circuit to match with said first power amplifier impedance matching circuit to form a first overall circuit, adjusting said second antenna impedance matching circuit so that a phase error of a signal outputted by said antenna meets a predetermined specification;
    (b) simulating a first impedance range of said first overall circuit by software, and displaying said first impedance range by a first locus on a Smith Chart;
    (c) providing a second power amplifier impedance matching circuit to match with said first antenna impedance matching circuit to form a second overall circuit;
    (d) simulating a second impedance range of said second overall circuit by software and displaying said second impedance range by a second locus on the Smith Chart; and
    (e) adjusting said second power amplifier impedance matching circuit to make said second locus overlap with said first locus.

* * * * *